US012293492B2

(12) United States Patent
Shimizu et al.

(10) Patent No.: US 12,293,492 B2
(45) Date of Patent: May 6, 2025

(54) SUBSTRATE PROCESSING APPARATUS AND MONITORING METHOD IN SUBSTRATE PROCESSING APPARATUS (71) Applicant: SCREEN Holdings Co., Ltd., Kyoto (JP)

(72) Inventors: Shinji Shimizu, Kyoto (JP); Ryo Yamada, Kyoto (JP); Tatsuya Masui, Kyoto (JP); Yuichi Deba, Kyoto (JP); Miwa Miyawaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 184 days.

(21) Appl. No.: 18/151,123

(22) Filed: Jan. 6, 2023

(65) Prior Publication Data
US 2023/0274397 A1 Aug. 31, 2023

(30) Foreign Application Priority Data

Feb. 28, 2022 (JP) .................. 2022-029224

(51) Int. Cl.
G06T 5/70 (2024.01)
B08B 3/04 (2006.01)
(Continued)

(52) U.S. Cl.
CPC ................ G06T 5/70 (2024.01); B08B 3/048 (2013.01); B08B 3/08 (2013.01); B08B 13/00 (2013.01);
(Continued)

(58) Field of Classification Search
None
See application file for complete search history.

(56) References Cited

U.S. PATENT DOCUMENTS 10,055,648 B1 * 8/2018 Grigsby .................. G06F 18/24
10,109,508 B2 * 10/2018 Ashidate ........... H01L 21/31111
(Continued)

FOREIGN PATENT DOCUMENTS

CN 102915650 A * 2/2013
CN 105761295 A * 7/2016 ............. G06T 13/60
(Continued)

OTHER PUBLICATIONS

KR 20150001940, Jo Sic, Jan. 7, 2015, pp. 1-8 (english translation).*
(Continued)

Primary Examiner — Ricky Chin
(74) Attorney, Agent, or Firm — OSTROLENK FABER LLP (57) ABSTRACT A substrate processing apparatus collectively processes a plurality of substrates with the plurality of substrates immersing in a processing liquid. The substrate processing apparatus includes a processing tank, a camera, and a controller. The processing tank stores the processing liquid. The camera is provided vertically higher above the processing tank and captures the inside of the processing tank to generate a plurality of items of captured image data. The controller generates smoothed image data obtained by smoothing a brightness distribution of waving caused on a liquid surface of the processing liquid based on integration of the plurality of items of captured image data, and monitors the inside of the processing tank based on the smoothed image data.

5 Claims, 7 Drawing Sheets (51) Int. Cl.
  *B08B 3/08* (2006.01)
  *B08B 13/00* (2006.01)
  *G06T 7/00* (2017.01)

(52) U.S. Cl.
  CPC .... *G06T 7/001* (2013.01); *G06T 2207/30108* (2013.01)

(56) References Cited

U.S. PATENT DOCUMENTS

| | | | |
|---|---|---|---|
| 2007/0177788 | A1 | 8/2007 | Liu |
| 2020/0043203 | A1* | 2/2020 | Ono .................. G03B 11/04 |
| 2020/0180937 | A1* | 6/2020 | Frith .................. G01S 17/08 |
| 2022/0005736 | A1* | 1/2022 | Naohara .............. H01L 22/12 |
| 2023/0274397 | A1* | 8/2023 | Shimizu ............ H01L 21/67253 |

FOREIGN PATENT DOCUMENTS

| | | | | |
|---|---|---|---|---|
| CN | 106157253 | A * | 11/2016 | |
| CN | 108073905 | A * | 5/2018 | ......... G06K 9/00718 |
| CN | 108470338 | A * | 8/2018 | ............... G06T 7/11 |
| CN | 108628026 | A * | 10/2018 | ......... G02B 27/2214 |
| CN | 108731772 | B * | 8/2019 | ......... G01F 23/0061 |
| CN | 110146123 | A * | 8/2019 | ............. G01D 21/02 |
| CN | 111950523 | A * | 11/2020 | ............. G06K 9/0063 |
| CN | 112212922 | A * | 1/2021 | ............. G01D 21/02 |
| CN | 112801925 | A * | 5/2021 | ............. G06T 5/002 |
| CN | 112986105 | A * | 6/2021 | |
| CN | 113413503 | A * | 9/2021 | |
| CN | 116666260 | A * | 8/2023 | ............. B08B 13/00 |
| CN | 116935327 | A * | 10/2023 | |
| EP | 4235756 | A1 * | 8/2023 | ............. B08B 13/00 |
| JP | 2004094438 | A | 3/2004 | |
| JP | 2009063398 | A | 3/2009 | |
| JP | 2010-500762 | A | 1/2010 | |
| JP | 2010121970 | A * | 6/2010 | |
| JP | 2019-050349 | A | 3/2019 | |
| JP | 6609231 | B2 | 11/2019 | |
| JP | 6639896 | B2 * | 2/2020 | |
| JP | 2022-158331 | A | 10/2022 | |
| KR | 20150001940 | A * | 1/2015 | |
| WO | WO 2008/019362 | A2 | 2/2008 | |
| WO | WO-2021031915 | A1 * | 2/2021 | ......... G06K 9/00342 |

OTHER PUBLICATIONS

JP 6639896, Okazaji, Feb. 5, 2020, pp. 1-6 (english translation).*
JP 2004094438, Adachi, Mar. 25, 2004, [0029]-[0032] (english translation).*
CN 110146123, Chen, Aug. 20, 2019, pp. 1-13 (english translation).*
Extended European Search Report dated Jun. 21, 2023 in corresponding European Patent Application No. 23151488.6.
Office Action and Search Report dated Nov. 30, 2023 in corresponding Taiwanese Patent Application No. 112103790 and English translation made from the Japanese translation of the original communication.
Notice of Decision to Grant dated Sep. 13, 2024 in corresponding Korean Patent Application No. 10-2023-0010763.

* cited by examiner

SUBSTRATE PROCESSING APPARATUS AND MONITORING METHOD IN SUBSTRATE PROCESSING APPARATUS

FIELD OF THE INVENTION

The present disclosure relates to a substrate processing apparatus and a monitoring method in the substrate processing apparatus.

DESCRIPTION OF THE BACKGROUND ART

Conventionally, batch-type substrate processing apparatuses that collectively process a plurality of substrates have been proposed (for example, Japanese Patent Application Laid-Open No. 2019-50349 and US Patent Application Publication No. 2007/0177788). In Japanese Patent Application Laid-Open No. 2019-50349 and US Patent Application Publication No. 2007/0177788, a substrate processing apparatus includes a processing tank that stores a processing liquid, and a plurality of substrates are immersed in the processing liquid in the processing tank, thereby, collectively processing a plurality of substrates.

Further, in Japanese Patent Application Laid-Open No. 2019-50349 and US Patent Application Publication No. 2007/0177788, an image capturing unit (camera) is provided to monitor the inside of the substrate processing apparatus. In Japanese Patent Laid-Open No. 2019-50349, the image capturing unit captures an image of the processing liquid stored in the processing tank, and a controller specifies the boiling state of the processing liquid based on the captured image. In US Patent Application Publication No. 2007/0177788, the camera captures an image of the interior of the processing tank from above, and an image processor determines the presence or absence of a substrate piece inside the processing tank based on the captured image.

Here, there is a possibility that, when the camera captures an image of the inside of the processing tank in a state where the processing liquid is stored in the processing tank, the captured image of the state of the inside of the processing tank may be obscure. This is because the state in the processing liquid is made visually indistinguishable by the surface reflection of the processing liquid. In particular, when waves are formed on the liquid surface of the processing liquid, the brightness distribution of the light reflected from the surface changes with the passage of time, which makes the state in the processing liquid all the more visually indistinguishable. Consequently, even if the camera captures an image of the processing tank from vertically above thereof while the processing liquid is stored in the processing tank, the state inside the processing tank is less likely to be grabbed in the captured image, and the substrate processing apparatus is incapable of monitoring the interior of the processing tank with sufficient accuracy.

SUMMARY

The present disclosure is directed to a substrate processing apparatus and a monitoring method in the substrate processing apparatus.

An aspect of the present disclosure is a substrate processing apparatus configured to collectively process a plurality of substrates by immersing the plurality of substrates in a processing liquid, which includes: a processing tank that stores the processing liquid, a camera provided vertically above the processing tank and configured to generate a plurality of items of captured image data obtained by capturing the inside of the processing tank in a state where the processing liquid is stored in the processing tank, and a controller configured to generate smoothed image data obtained by smoothing a brightness distribution of waving caused on a liquid surface of the processing liquid based on integration of the plurality of items of captured image data, and monitor the inside of the processing tank based on the smoothed image data.

In the smoothed image data, the brightness distribution of the waving is smoothed, so the inside of the processing tank can be seen more clearly. Therefore, the controller can monitor the inside of the processing tank with higher accuracy.

Preferably, the substrate processing apparatus further includes a storage configured to store reference image data obtained based on integration of a plurality of items of normal image data generated by the camera capturing the inside of the processing tank in normal condition, in which the controller is configured to determine whether there is an abnormality in the processing tank based on comparison between the smoothed image data and the reference image data.

Also in the reference image data, the brightness distribution of the waving on the liquid surface can be smoothed. Therefore, the influence of the waving on the liquid surface can be suppressed in the comparison between the smoothed image data and the reference image data. Therefore, the influence of the waving on the liquid surface is suppressed and whether there is an abnormality inside the processing tank can be determined with higher accuracy.

Preferably, a frame rate of the camera is set according to a frequency of the waving caused on the liquid surface of the processing liquid.

The Brightness distribution of the waving can be smoothed more appropriately.

Preferably, a frame rate of the camera is ten times or more the frequency of the waving caused on the liquid surface of the processing liquid.

The Brightness distribution of the waving can be smoothed more appropriately.

Preferably, a capturing period of the camera is one cycle or more the waving caused on the liquid surface of the processing liquid.

The Brightness distribution of the waving can be smoothed more appropriately.

An aspect of the present disclosure is a monitoring method in a substrate processing apparatus, which includes: a capturing step in which a camera provided vertically above the processing tank generates a plurality of items of captured image data obtained by capturing the inside of the processing tank in a state where the processing liquid is stored in the processing tank, a waving smoothing step generating smoothed image data obtained by smoothing a brightness distribution of waving caused on a liquid surface of the processing liquid based on integration of the plurality of items of captured image data is generated, and a monitoring step monitoring inside of the processing tank based on the smoothed image data.

In the smoothed image data, the brightness distribution of the waving is smoothed, so the inside of the processing tank can be seen more clearly. Therefore, the controller can monitor the inside of the processing tank with higher accuracy.

Therefore, an object of the present disclosure is to monitor the inside of a processing tank with higher accuracy even when a processing liquid is stored in the processing tank.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

Hereinafter, an embodiment will be described with reference to the attached drawings. It should be noted that the drawings are schematically shown, and for the convenience of explanation, some omissions or simplifications of the configuration may be made in the drawings as appropriate. Also, the mutual relationship among sizes and positions in configurations and the like illustrated in the drawings are not necessarily accurate and may be changed as appropriate.

In addition, in the following description, the same components are denoted by the same reference numerals, and the names and functions thereof are also similar. Accordingly, detailed descriptions thereof may be omitted to avoid redundancy.

Also, in the following description to be written, even though ordinal numbers such as "first" and "second" may be used, these terms are for promoting the understanding of the contents of the embodiment and are not for defining the order that may be caused by such ordinal numbers.

In the use of terms that express the relative or absolute positional relationship (for example, "in one direction" "along one direction", "parallel", "orthogonal", "center", "concentric", "coaxial", etc.), the terms express not only a state where the precise positional relationship is described, but also a state of being displaced relative to an angle or distance to the extent that tolerance or similar functionality is obtained, unless otherwise specified. In the use of descriptions representing equivalency such as "same", "equal", and "homogeneous", the descriptions include the case of being a quantitatively exact equal state and the case where there is a difference within the tolerance or the range where the same function can be obtained, unless otherwise specified. Further, unless otherwise specified, in the use of descriptions representing shapes (for example, "quadrangle", "cylinder", or the like), the descriptions express not only geometrically precisely the shapes but also express shapes insofar as similar effects can be achieved, and the shapes may include, for example, a roughened portion, a chamfered portion, and the like. In the use of an expression that an X "is provided with", "equips", "comprises", "includes", or "has", the expression is not an exclusive expression that excludes the existence of other components. Further, in the use of an expression "at least one of A, B, and C" includes "only A", "only B", "only C", "any two of A, B, and C", and "all of A, B, and C".

<Overview of Configuration of Substrate Processing Apparatus>

Figure 1:
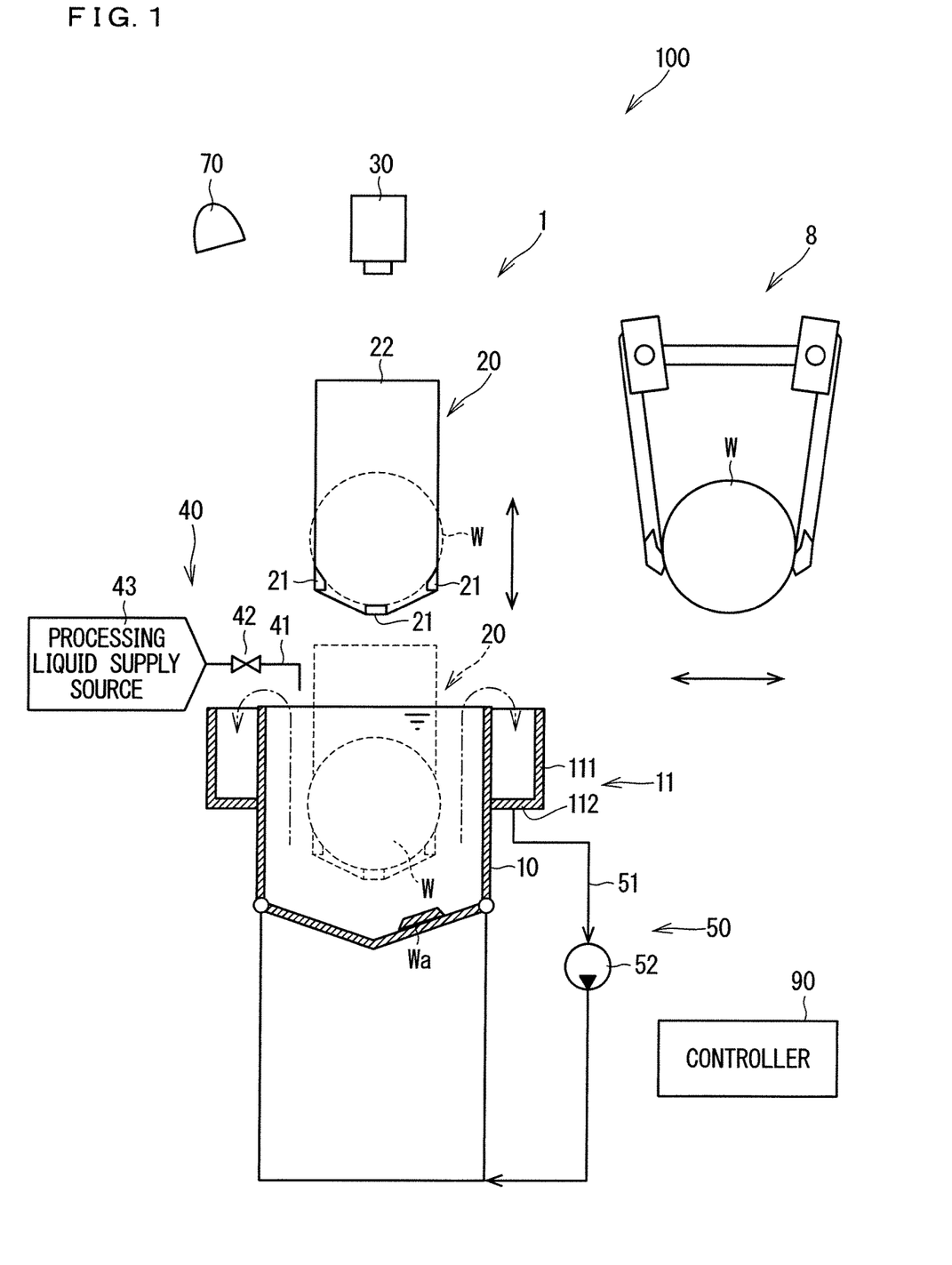
FIG. 1 is a diagram schematically illustrating an example of a configuration of a substrate processing apparatus according to an embodiment.

FIG. 1 is a diagram schematically illustrating an example of a configuration of a substrate processing apparatus 100 according to an embodiment. The substrate processing apparatus 100 is a batch-type processing apparatus that processes a plurality of substrates W collectively.

In the example of FIG. 1, the substrate processing apparatus 100 includes at least one processing unit 1 and a transporting unit 8. The transporting unit 8 is a so-called transporting robot, which transports a plurality of unprocessed substrates W to the processing unit 1. The processing unit 1 collectively processes the plurality of unprocessed substrates W loaded in from the transporting unit 8. Further, the transporting unit 8 receives the plurality of processed substrates W processed by the processing unit 1 from the processing unit 1 and transports them to another. When the substrate processing apparatus 100 includes a plurality of processing units 1, the transporting unit 8 may transport the plurality of substrates W to the other processing units 1.

<Transporting Unit>

The transporting unit 8 holds the plurality of substrates W in an upright orientation. The upright orientation referred to here indicates an orientation in which the thickness direction of the substrate W is along the horizontal direction. The transporting unit 8 holds the plurality of substrates W in a state where the plurality of substrates W are aligned with a gap therebetween in the thickness direction. The transporting unit 8 is provided movably along the horizontal direction, for example, and transports the plurality of substrates W. In the example of FIG. 1, the transporting direction of the transporting unit 8 is indicated by a two direction arrow in the vicinity of the transporting unit 8.

<Processing Unit>

The processing unit 1 collectively processes the plurality of substrates W with the plurality of substrates W immersing in the processing liquid. As shown in FIG. 1, the processing unit 1 includes a processing tank 10, a lifter 20, a camera 30, and a controller 90. The processing tank 10 has a box-shape that opens vertically upward and stores the processing liquid. Although the processing liquid is not particularly limited to any, and includes, for example, a chemical liquid of phosphoric acid, sulfuric acid, or the like. In this case, the processing unit 1 subjects the plurality of substrates W to the collective cleaning processing.

In the example of FIG. 1, the processing unit 1 is provided with a liquid supply unit 40. The liquid supply unit 40 supplies the processing liquid to the processing tank 10. In the example of FIG. 1, the liquid supply unit 40 includes a liquid supply pipe 41 and a valve 42. The liquid supply pipe 41 is a pipe for supplying the processing liquid to the processing tank 10 and the upstream end thereof is connected to the processing liquid supply source 43. The processing liquid supply source 43 includes a tank that stores the processing liquid. The downstream end of the liquid supply pipe 41 serves as a discharge port, and the processing liquid is discharged from the downstream end of the liquid supply pipe 41. In the example of FIG. 1, the downstream end of the liquid supply pipe 41 is provided vertically higher above than the processing tank 10, and the processing liquid discharged from the liquid supply pipe 41 flows down toward the inside of the processing tank 10.

The valve 42 is provided on the liquid supply pipe 41. When the valve 42 is opened, the processing liquid from the processing liquid supply source 43 is supplied to the processing tank 10 through the liquid supply pipe 41. The processing liquid is stored in the processing tank 10. When the valve 42 is closed, the supply of processing liquid to the processing tank 10 is stopped.

In the example of FIG. 1, the processing unit 1 is provided with an up-flow tank 11 and a circulation unit 50. The up-flow tank 11 is an external tank which opens vertically upward and receives the processing liquid overflowing from the processing tank 10. In the example of FIG. 1, the up-flow tank 11 includes a side wall 111 having a cylindrical shape and surrounding the processing tank 10 on the outer peripheral side of the processing tank 10, and a bottom 112 having an annular shape in a plan view and connecting the lower end peripheral edge of the side wall 111 and the side wall of the processing tank 10.

The circulation unit 50 circulates the processing liquid in a manner of returning the processing liquid received in the up-flow tank 11 to the processing tank 10. In the example of FIG. 1, the circulation unit 50 includes a circulation pipe 51 and a pump 52. The circulation pipe 51 is a pipe for flowing the processing liquid from the up-flow tank 11 to the processing tank 10. The upstream end of the circulation pipe 51 is connected to, for example, the bottom 112 of the up-flow tank 11, and the downstream end of the circulation pipe 51 is connected to, for example, the bottom of the processing tank 10. In the example of FIG. 1, the circulation pipe 51 is branched, and the downstream end of each branch pipe is connected to the processing tank 10, respectively. The pump 52 is provided on the circulation pipe 51 and pumps the processing liquid from the up-flow tank 11 toward the processing tank 10.

The circulation unit 50 circulates the processing liquid so that the processing liquid in the processing tank 10 continues to flow. Specifically, the processing liquid flows vertically upward inside the processing tank 10, overflows the upper opening of the processing tank 10, and flows into the up-flow tank 11. The processing liquid that has flowed into the up-flow tank 11 flows through the circulation pipe 51 into the bottom of the processing tank 10 again. Note, in the example of FIG. 1, the flow of the processing liquid is schematically indicated by dashed-dotted arrows. Accordingly, the processing liquid continues to flow inside the processing tank 10 in this manner and the suppression of impurities such as particles staying in the processing tank 10 is ensured. Therefore, reattachment of impurities to the substrates W can be suppressed.

Although not shown in FIG. 1, the processing unit 1 is provided with a drainage unit for discharging the processing liquid in the processing tank 10 and the up-flow tank 11 to the outside.

The lifter 20 moves the plurality of substrates W up and down between a delivery position vertically above the processing tank 10 and a processing position inside the processing tank 10. In the example of FIG. 1, the lifter 20 positioned at the delivery position is indicated by a solid line, and the lifter 20 positioned at the processing position is indicated by a broken line. In the example of FIG. 1, the moving direction of the lifter 20 is indicated by a two direction arrow in the vicinity of the lifter 20. The lifter 20 delivers the plurality of substrates W to and from the transporting unit 8 at the delivery position. That is, the transporting unit 8 can transport the plurality of substrates W to the delivery position.

At the delivery position, the lifter 20 receives the plurality of unprocessed substrates W from the transporting unit 8 and holds the plurality of substrates W. The lifter moves down the plurality of substrates W from the delivery position to the processing position, thereby immersing the plurality of substrates W in the processing liquid in the processing tank 10. Accordingly, the processing liquid acts on the plurality of substrates W, and the plurality of substrates W are subjected to a collective process based on a processing liquid. After a predetermined processing time has elapsed, the lifter 20 moves up the plurality of processed substrates W from the processing position to the delivery position. Further, the transporting unit 8 receives the plurality of processed substrates W from the lifter 20 and transports the plurality of substrates W to an other unit.

In the example of FIG. 1, the lifter 20 includes a plurality of (three in the drawing) holding members 21 and a support plate 22. The support plate 22 has a plate-like shape, and is provided in an orientation in which the thickness direction thereof is along the arrangement direction of the substrates W. Each of the plurality of holding members 21 has an elongated shape extending along the arrangement direction, and one end thereof is connected to the support plate 22. Each of the holding members 21 is formed with a plurality of holding grooves (not shown) that are aligned with a gap therebetween in the arrangement direction, and each substrate W is partially inserted into the holding grooves so that the plurality of holding members 21 hold the plurality of substrates W in an upright orientation. The plurality of holding members 21 are aligned at intervals in the direction along the lower side portion of the side surface of the substrate W and support the lower side portion of the side surface of each substrate W.

The lifter 20 includes an elevating mechanism (not shown) that moves up and down the support plate 22. As a result, the plurality of holding members 21 connected to the support plate 22 and the plurality of substrates W held by the holding members 21 move up and down. For example, the elevating mechanism includes a motor as a drive source and a ball screw mechanism as a drive mechanism.

Meanwhile, an occurrence of abnormality inside the processing tank 10 may disturb the processing of the plurality of substrates W. For example, when a substrate W cracks, a fragment (hereinafter referred to as a substrate piece Wa) thereof may fall down from the lifter 20 and remain inside the processing tank 10. Should a foreign matter such as the substrate piece Wa remain inside the processing tank 10, the processing of the substrates W may be disturbed.

Therefore, in the embodiment, the camera 30 is provided to monitor the inside of the processing tank 10. The camera 30 captures a capturing region including the inside of the processing tank 10 to generate captured image data (hereinafter simply referred to as captured image IM1). The camera 30 outputs a captured image IM1 to the controller 90. The camera 30 includes, for example, a charge coupled device (CCD) image sensor or a complementary metal oxide semiconductor (CMOS) image sensor, and an optical system that guides light from the capturing region to the light receiving surface of the image sensor.

The camera 30 is provided vertically higher above the processing tank 10. Therefore, the camera 30 captures the processing tank 10 from vertically above. The capturing region of the camera 30 preferably includes the entire upper opening of the processing tank 10. The capturing direction of the camera 30 may be along the vertically downward direction, or may be along the oblique downward direction inclined from the vertical direction. In the example of FIG. 1, the camera 30 is provided immediately above the processing tank 10.

In the example of FIG. 1, the processing unit 1 is also provided with an illumination unit 70. The illumination unit 70 has a light source such as a light emitting diode, and irradiates the capturing region with illumination light. In the example of FIG. 1, the illumination unit 70 is provided vertically higher above the processing tank 10. The irradiation direction of the illumination unit 70 may be along the vertically downward direction, or may be along the oblique downward direction. The illumination unit 70 emits illumination light, so that the camera 30 can capture an image of a brighter capturing region.

Figure 2:
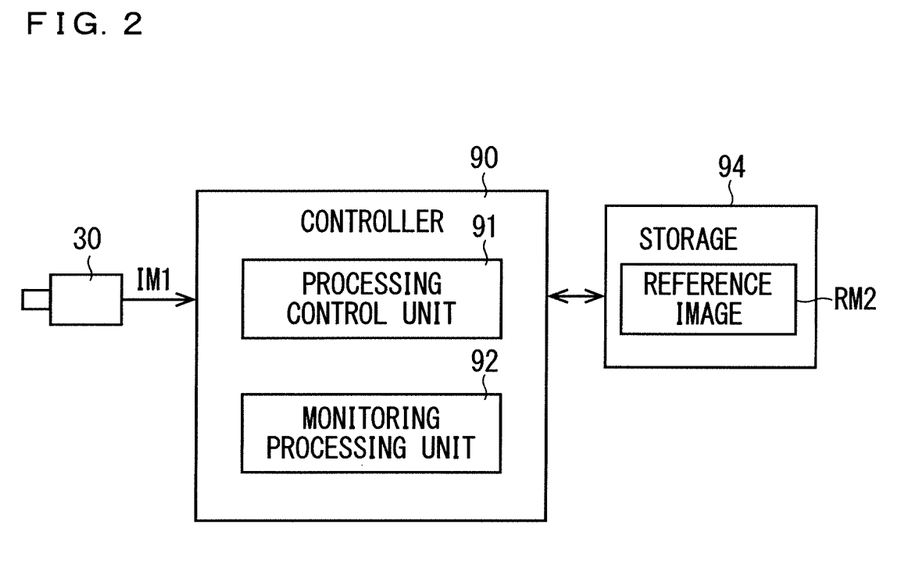
FIG. 2 is a functional block diagram showing an example of an internal configuration of a controller.

The controller 90 controls various configurations in the substrate processing apparatus 100 and monitors the inside of the processing tank 10 based on the captured image IM1 from the camera 30. FIG. 2 is a functional block diagram showing an example of an internal configuration of a controller 90. In the example of FIG. 2, the controller 90 includes a processing control unit 91 and a monitoring processing unit 92. The processing control unit 91 controls various configurations of the processing unit 1 (for example, the elevating mechanism of the lifter 20, the valve 42, the pump 52, etc.) and the transporting unit 8, and causes the processing unit 1 to process the plurality of substrates W. The monitoring processing unit 92 controls the camera 30 and the illumination unit 70, and monitors the inside of the processing tank 10 based on the captured image IM1 from the camera 30.

Figure 3:
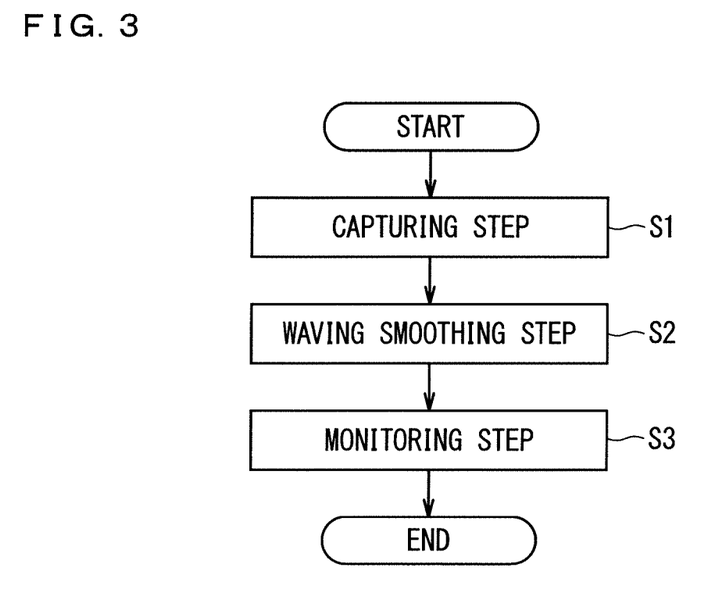
FIG. 3 is a flowchart showing an example of monitoring processing.

FIG. 3 is a flowchart showing an example of monitoring processing. The monitoring process is performed in a state where the lifter 20 does not hold the plurality of substrates W and in a state where the processing liquid is stored in the processing tank 10. Further, waving is caused on the liquid surface of the processing liquid in the processing tank 10. The waving is caused, for example, by circulation of the processing liquid by the circulation unit 50 (up-flow circulation). That is, here, as an example, the following monitoring process is performed in a state where the plurality of substrates W are not held by the lifter 20 and up-flow circulation is performed.

First, the camera 30 captures a capturing region including the inside of the processing tank 10 at a predetermined frame rate fa to generate a plurality of captured images IM1 (Step S1: Capturing Step). Here, the camera 30 captures the capturing region at the frame rate fa over a predetermined capturing period Ta, and generates N captured images IM1. The N captured images IM1 indicate the capturing region at different points in time. The camera 30 outputs the N captured images IM1 to the controller 90. In the capturing step, the illumination unit 70 may irradiate the capturing region with illumination light. Accordingly, the camera 30 can capture a lighter capturing region.

Figure 4:
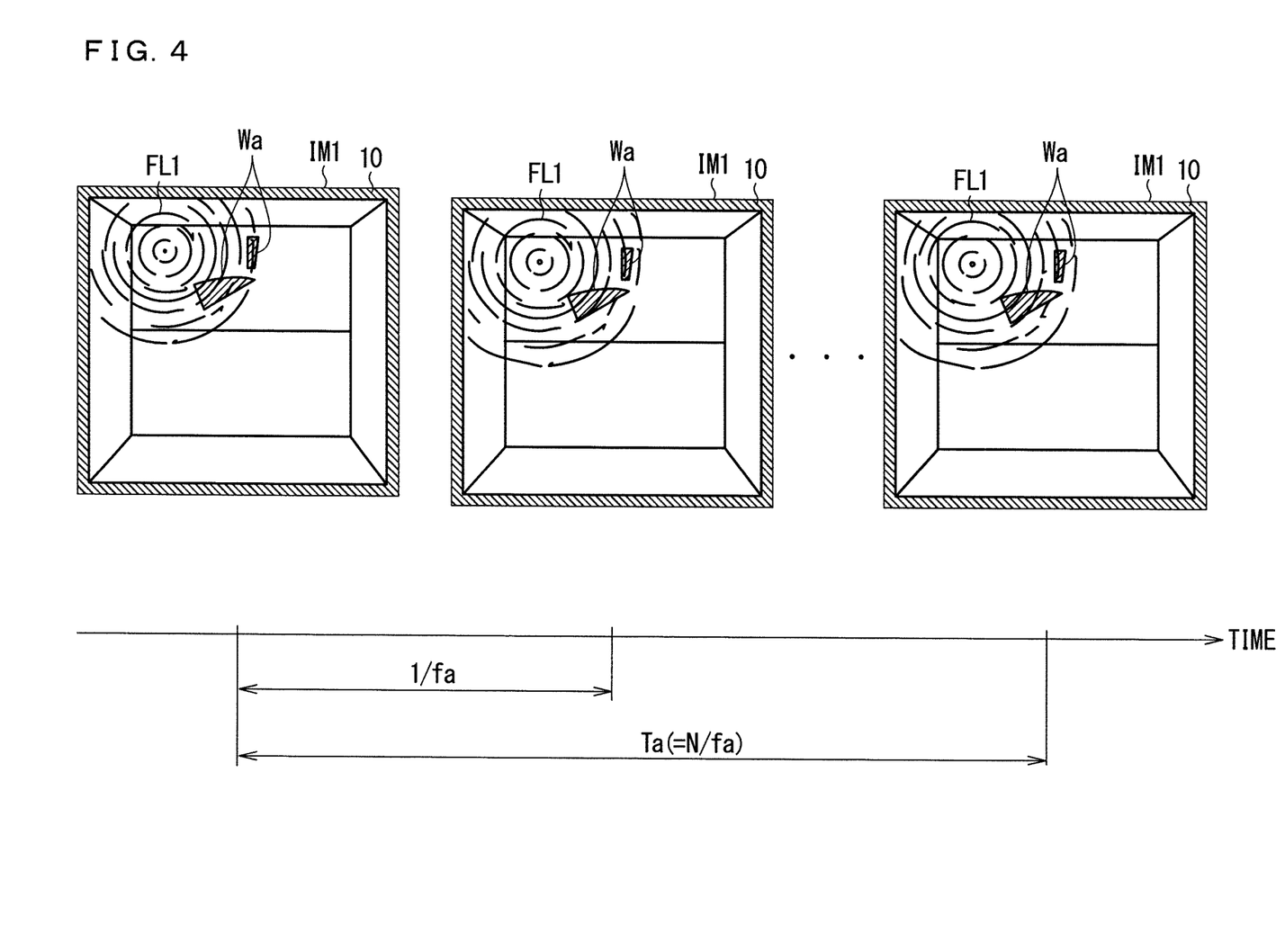
FIG. 4 is a diagram schematically showing an example of a plurality of captured images arranged in chronological order.

FIG. 4 is a diagram schematically showing an example of the plurality of captured images arranged in chronological order. In the example of FIG. 4, each captured image IM1 includes the entire upper opening of the processing tank 10. Also, each captured image IM1 also includes a brightness distribution FL1 derived from the waving on the liquid surface of the processing liquid stored in the processing tank 10. In the example of FIG. 4, ripples that spread in an annular shape are formed on the liquid surface of the processing liquid. The brightness distribution FL1 represents here is the brightness distribution corresponding to the ripples, and is the brightness distribution of the element derived from the waving on the liquid surface of the brightness distribution in the image. The state of waving on the liquid surface changes with the elapse of time; therefore, the brightness distribution FL1 also changes with the elapse of time. It should be noted that in the example of FIG. 4, although the ripples are schematically formed only in part, they may actually spread on the entire liquid surface.

In the example of FIG. 4, each captured image IM1 includes substrate pieces Wa remains at the bottom of the processing tank 10. However, the substrate piece Wa overlap the brightness distribution FL1 indicating waving on the liquid surface in each captured image IM1. Therefore the shapes of the substrate pieces Wa in each captured image IM1 are obscure due to the waving on the liquid surface.

Figure 5:
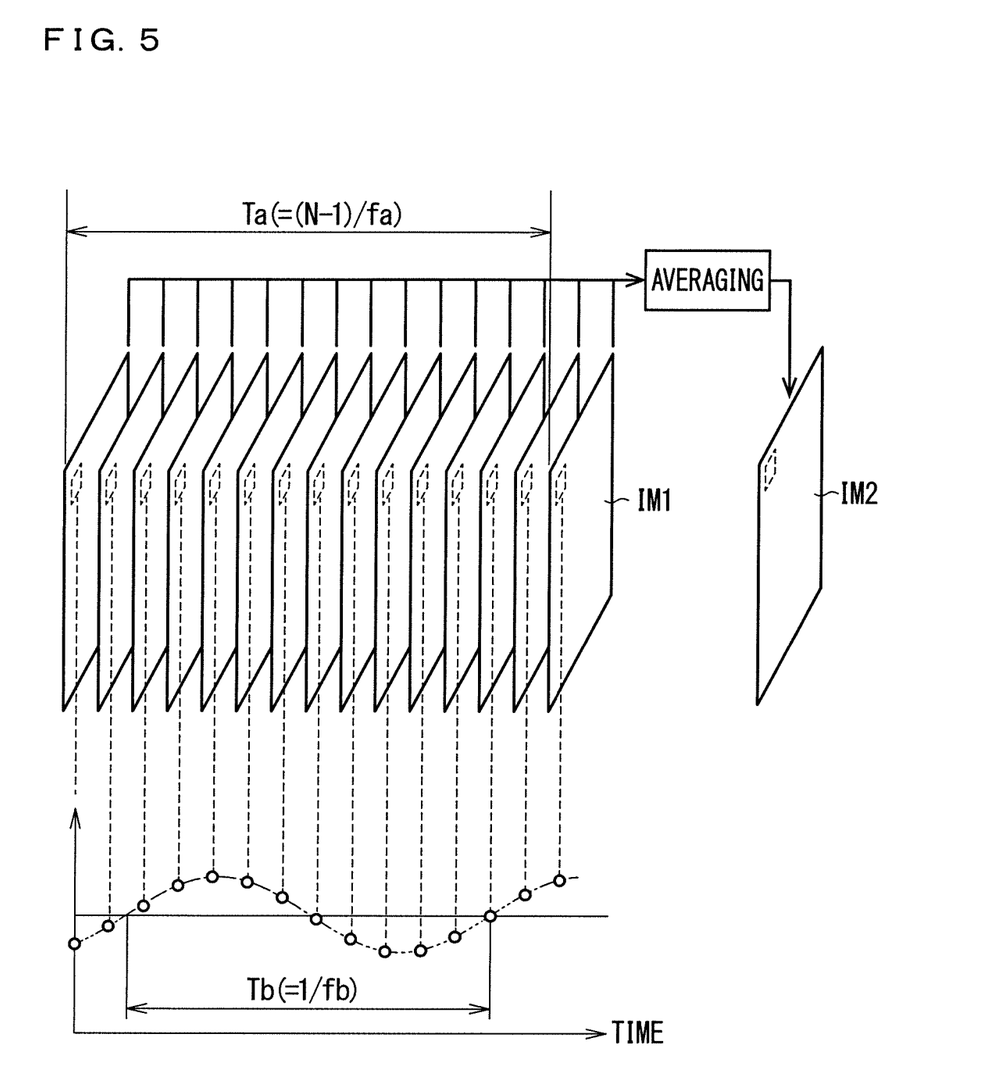
FIG. 5 is a diagram schematically showing an example of the relationship between a plurality of captured images and a smoothed image.

Next, based on the integration of the N captured images IM1, the monitoring processing unit 92 generates smoothed image data (hereinafter referred to as a smoothed image IM2) obtained by smoothing the brightness distribution FL1 (Step S2: Waving Smoothing Step). FIG. 5 is a diagram schematically showing an example of the relationship between the plurality of captured images IM1 and the smoothed image IM2. As a more specific example, the monitoring processing unit 92 averages the N captured images IM1 to generate the smoothed image IM2. Specifically, the monitoring processing unit 92 executes averaging processing for each pixel in which pixel values of pixels at the same coordinates are integrated in N captured images IM1 to calculate an integrated value, and the integrated value is divided by the number of sheets N. Consequently, the monitoring processing unit 92 can generate the smoothed image IM2.

FIG. 5 also shows a graph schematically showing positional changes of the liquid surface with time corresponding to one pixel in the brightness distribution FL1 in the captured image IM1. In the example of FIG. 5, the position of the liquid surface of one pixel changes sinusoidally over time due to the waving. A plurality of plot points indicated by circles in the graph respectively indicate positions of the liquid surface corresponding to the one pixel in the plurality of captured images IM1. The pixel value (brightness) of the pixel depends on the position on the liquid surface; therefore, it can be said that the graph in FIG. 5 reflects the pixel value.

In the example of FIG. 5, the capturing period Ta is longer than the waving period Tb of the liquid surface. The capturing period Ta may be, for example, twice or more the period Tb, or may be three times or more. Also, the frame rate fa is set according to the waving frequency fb of the liquid surface, and is higher than the frequency fb. More specifically, the frame rate fa is ten times or more the frequency fb, for example. The waving frequency fb (=1/Ta) of the liquid surface can be specified in advance by image analysis of the captured image IM1. For example, the controller 90 can calculate the frequency fb in advance based on the changes in pixel values with time in a plurality of captured images IM1 captured in experiment in advance. Therefore, the capturing period Ta and the frame rate fa can be set in advance. The waving frequency fb on the liquid surface has a predetermined relationship with the wavelength of the waving of the liquid surface; therefore, it can be said that the capturing period Ta and the frame rate fa are set according to the wavelength. Also, the waving on the liquid surface may also have a plurality of frequency components. In this case, the capturing period Ta may be set longer than the period of the fundamental wave component, and the frame rate fa may be set to ten times or more the frequency of the fundamental wave component.

As can be understood from the graph in FIG. 5, if the pixel values that vary according to the waving on the liquid surface are averaged over one cycle or more, ideally, the effect of the waving on the liquid surface is canceled and the average value turns to a constant value. The average value is obtained by dividing the integrated value by the number of sheets N; therefore, the integrated value is also a constant value. This is the same for pixel values of other pixels. Therefore, in the smoothed image IM2 generated based on the integration of the N captured images IM1, the brightness distribution FL1 indicating the waving on the liquid surface of the processing liquid is smoothed.

Figure 6:
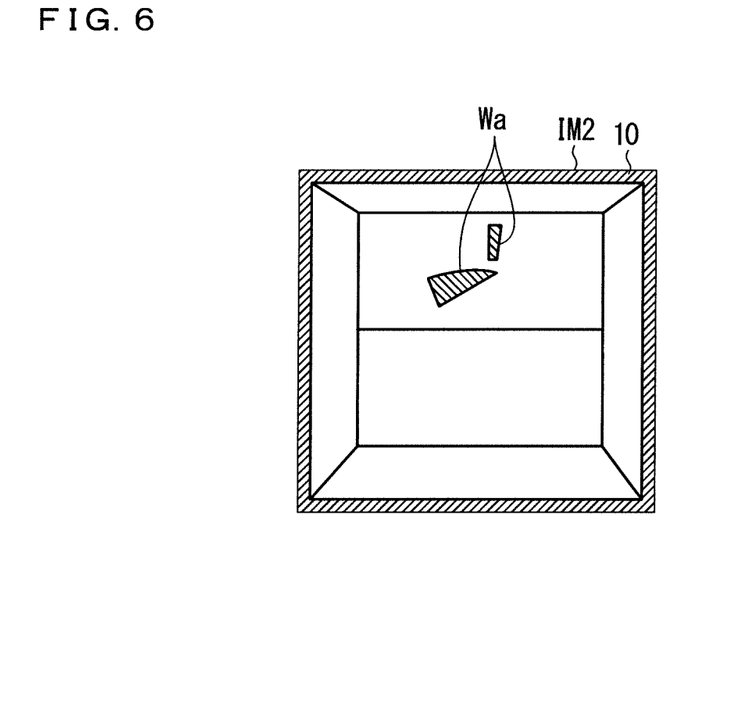
FIG. 6 is a diagram schematically showing an example of a smoothed image.

FIG. 5 is a diagram schematically showing an example of the smoothed image IM2. As illustrated in FIG. 6, in the smoothed image IM2, the waving of the liquid surface in each captured image IM1 is suppressed, and the inside of the processing tank 10, that is, the state in the processing liquid becomes clearer. The smoothed image IM2 of FIG. 6 includes the substrate pieces Wa remaining on the bottom surface of the processing tank 10 which appears more clearly than the substrate pieces Wa in the captured image IM1.

Moreover, in the above example, the capturing period Ta is equal to or longer than the period Tb, and the frame rate fa is equal to or higher than ten times the frequency fb. According to this, averaging of changes with time due to the waving on the liquid surface is implemented with higher accuracy, and smoothing of the brightness distribution FL1 in the smoothed image IM2 is more effectively implemented. That is, the state in the processing liquid in the smooth image IM2 can be made even clearer. Waving on the liquid surface in the smoothed image IM2 can be reduced as the number of sheets N increases, so the frame rate fa may be 15 or more times the frequency fb, or 20 or more times the frequency fb.

Next, the monitoring processing unit 92 monitors the inside of the processing tank 10 based on the smoothed image IM2 (Step S3: Monitoring Step). The inside of the processing tank 10 is more clearly shown in the smoothed image IM2; therefore, the monitoring processing unit 92 can monitor the inside of the processing tank 10 with higher accuracy.

Here, as an example, the monitoring processing unit 92 monitors the inside of the processing tank 10 based on comparison between the smoothed image IM2 and reference image data (hereinafter referred to as reference image RM2). The reference image RM2 is an image including the normal processing tank 10, and is an image of the same region as the smoothed image IM2. The reference image RM2 is stored in a storage 94 in advance. The storage 94 is, for example, a non-temporary storage (for example, a memory).

Figure 7:
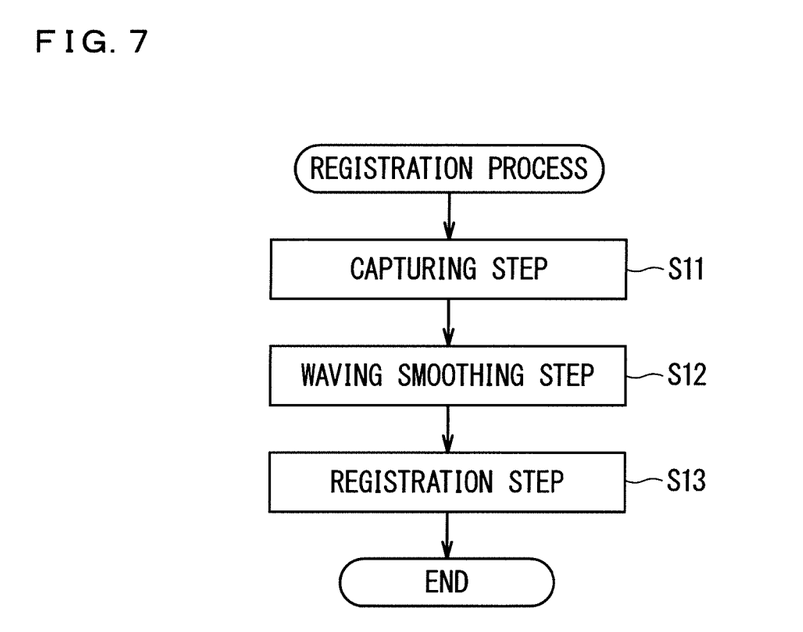
FIG. 7 is a flowchart showing an example of a pre-registration process.

The reference image RM2 is stored in the storage 94, for example, by a pre-registration process described below. FIG. 7 is a flowchart showing an example of the pre-registration process. The registration process is performed when the substrate processing apparatus 100 does not subject the substrates W to the processing. Further, the registration process is executed in a state where the lifter 20 does not hold the plurality of substrates W and the up-flow circulation is being performed. Also, no abnormality occurred inside the processing tank 10, and the inside of the processing tank 10 is normal.

In this state, the camera 30 captures the inside of the processing tank 10 at a predetermined frame rate fc to generate a plurality of items of normal image data (hereinafter referred to as normal image RM1) (Step S11). Here, the camera 30 captures the capturing region at the predetermined frame rate fc over a predetermined capturing period Tc to generate a plurality of normal images RM1. The camera 30 outputs the plurality of normal images RM1 to the controller 90. The capturing period Tc is equal to or longer than the period Tb, and may be the same as the capturing period Ta. The frame rate fc is ten times or more the frequency fb, and may be the same as the frame rate fa.

Figure 8:
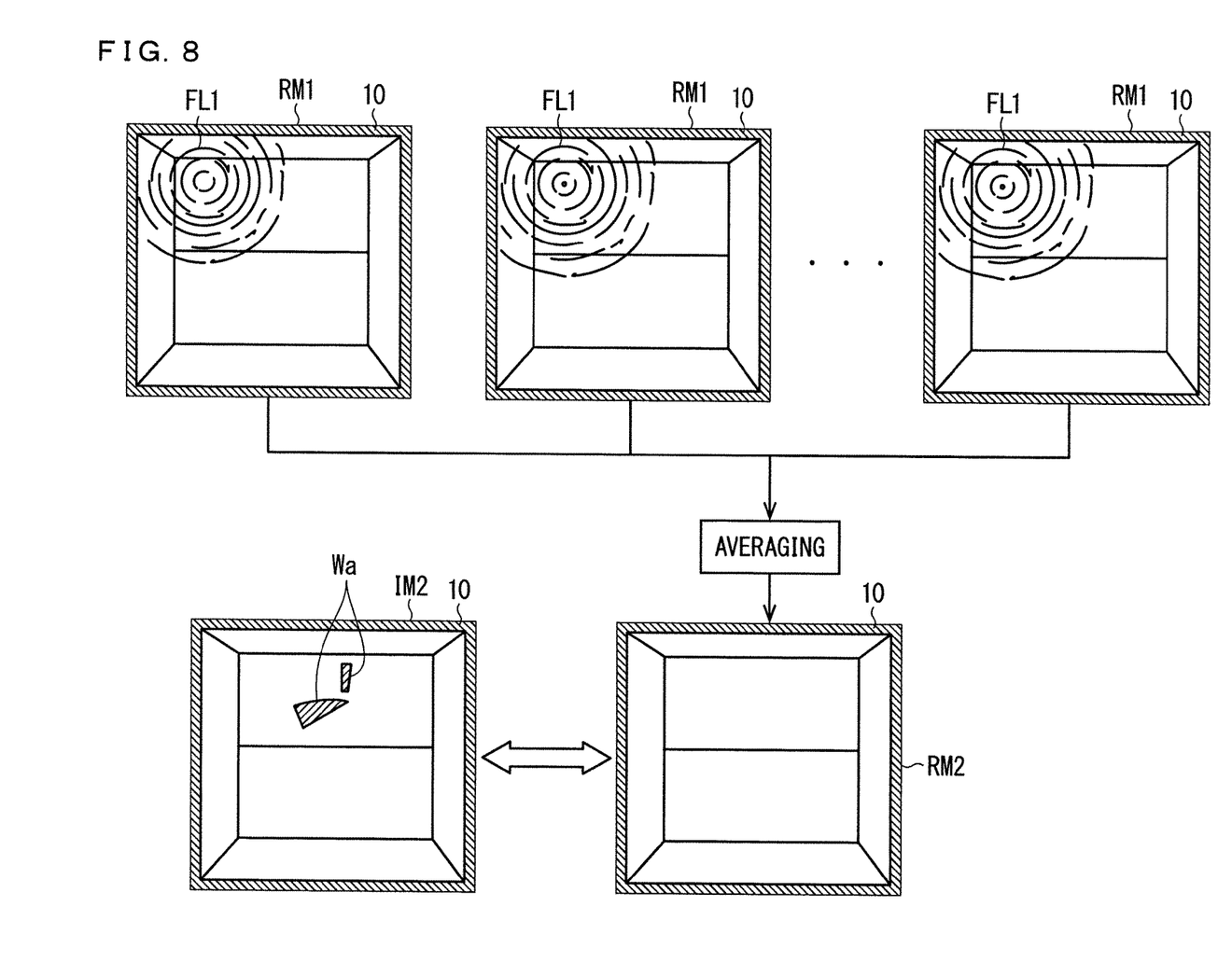
FIG. 8 is a diagram schematically showing an example of various images in the registration process.

FIG. 8 is a diagram schematically showing an example of various images in the registration process. In the example of FIG. 8, it is shown that the plurality of normal images RM1 are arranged in chronological order. Each normal image RM1 includes a normal processing tank 10, and also includes a brightness distribution FL1 that changes with time according to waving on the liquid surface.

Next, the controller 90 generates the reference image RM2 based on integration of the normal images RM1 (Step S12: Waving Smoothing Step). As a specific example, the controller 90 averages the plurality of normal images RM1 to generate the reference image RM2. In the reference image RM2, the brightness distribution FL1 due to the waving on the liquid surface is smoothed similarly to the smoothed image IM2, so the inside of the processing tank 10 becomes clearer.

Next, the controller 90 stores the reference image RM2 in the storage 94 (Step S13: Registration Step).

The reference image RM2, which includes the inside of the normal processing tank 10 and in which the brightness distribution FL1 due to the waving on the liquid surface has been smoother, can be stored in the storage 94 in advance by the above registration process.

Therefore, the monitoring processing unit 92 reads out the reference image RM2 from the storage 94 in Step S3 of the monitoring process. The monitoring processing unit 92 compares the smoothed image IM2 and the reference image RM2 to determine whether there is an abnormality inside the processing tank 10. When there is no abnormality inside the processing tank 10, the difference between the smoothed image IM2 and the reference image RM2 is small, and when there is an abnormality inside the processing tank 10, the difference between the smoothed image IM2 and the reference image RM2 is remarkable. Therefore, when the difference between the smoothed image IM2 and the reference image RM2 is smaller than a predetermined level, the monitoring processing unit 92 determines that the inside of the processing tank 10 is normal, and when the difference between the smoothed image IM2 and the reference image RM2 is equal to or greater than the predetermined level, the monitoring processing unit 92 determines that an abnormality has occurred inside the processing tank 10.

As a specific example, the monitoring processing unit 92 may calculate a degree of similarity between the smoothed image IM2 and the reference image RM2. Although not particularly limited, the degree of similarity may be any known degree of similarity, for example, the sum of squared differences of pixel values, the sum of absolute differences of pixel values, normalized cross-correlation, and zero-mean normalized cross-correlation.

The monitoring processing unit 92 determines whether or not the degree of similarity is greater than or equal to a predetermined threshold. The threshold value is a threshold value for determining the presence or absence of abnormality, and is set in advance by simulation or experiment, for example, and stored in the storage 94. When the degree of similarity is equal to or greater than the threshold, the monitoring processing unit 92 determines that the inside of the processing tank 10 is normal. Whereas, when the degree of similarity is smaller than the threshold, the monitoring processing unit 92 determines that an abnormality has occurred inside the processing tank 10. At this point, the monitoring processing unit 92 may determine that a substrate piece Wa remains inside the processing tank 10.

In the example of FIG. 8, the smoothed image IM2 includes the substrate pieces Wa remaining on the bottom surface of the processing tank 10, whereas the reference image RM2 does not include the substrate pieces Wa. Therefore, the degree of similarity between the smoothed image IM2 and the reference image RM2 is lower than the threshold. Therefore, in this case, the monitoring processing unit 92 determines that an abnormality has occurred inside the processing tank 10.

When the controller 90 determines that an abnormality has occurred inside the processing tank 10, the controller 90 may execute either an interruption process or a notification process. The interruption process is processing for causing the substrate processing apparatus 100 to suspend processing. The notification process is a process of causing a notification unit (for example, a display, not shown) provided in the substrate processing apparatus 100 to notify the abnormality. This notification allows the user to recognize the occurrence of the abnormality.

As described above, the monitoring processing unit 92 monitors the inside of the processing tank 10 based on the smoothed image IM2 in the Monitoring Step. As described above, in the smoothed image IM2, the brightness distribution FL1 indicating waving occurring on the liquid surface of the processing liquid is smoothed compared to the captured image IM1. Therefore, the state inside the processing tank 10 becomes clearer in the smoothed image IM2. The monitoring processing unit 92 monitors the inside of the processing tank 10 based on the smoothed image IM2 in which the inside of the processing tank 10 is clearer; therefore, the inside of the processing tank 10 can be monitored with higher accuracy.

Moreover, in the above example, the capturing period Ta of the camera 30 is equal to or longer than the period Tb of waving on the liquid surface (see also FIG. 5). In other words, the product (N−1)·fa (=Ta) of the value (N−1) obtained by subtracting 1 from the number N of the captured images IM1 used to generate the smoothed image IM2 and the frame rate fa of the camera 30 is greater than or equal to period Tb. Therefore, the monitoring processing unit 92 can integrate the N captured images IM1 captured in the capturing period Ta that is equal to or longer than one cycle of waving of the liquid surface. Therefore, the monitoring processing unit 92 can more appropriately smooth the brightness distribution FL1.

Also, in the above example, the frame rate fa of the camera 30 is ten times or more the frequency fb of waving on the liquid surface. Therefore, the monitoring processing unit 92 can generate the smoothed image IM2 using more captured images IM1 for one cycle of the waving on the liquid surface, and can smooth the brightness distribution FL1 more appropriately.

Further, in the above specific example, the monitoring processing unit 92 compares the smoothed image IM2 and the reference image RM2 to determine whether there is an abnormality inside the processing tank 10. The reference image RM2 is generated based on the integration of a plurality of normal images RM1; therefore, the brightness distribution FL1 due to the waving on the liquid surface of the processing liquid is also smoothed in the reference image RM2. Waving on the liquid surface, therefore, does not significantly affect the degree of similarity between the smoothed image IM2 and the reference image RM2. Therefore, the monitoring processing unit 92 can suppress the influence of the liquid surface and determine whether or not there is an abnormality inside the processing tank 10 with higher accuracy.

<Frame Rate>

The waving frequency fb occurring on the liquid surface of the processing liquid can depend on the storage amount of processing liquid in the processing tank 10. That is, the frequency fb when the storage amount of the processing liquid is large can be different from the frequency fb when the storage amount of the processing liquid is small. Therefore, the frame rate fa of the camera 30 may be set according to the storage amount. For example, the corresponding relationship between the storage amount and the frame rate fa may be set in advance by simulation or experiment and stored in the storage 94. The controller 90 may, for example, grasp the storage amount in the processing tank 10 as the specifications of the processing tank 10, and determine the frame rate fa based on the storage amount and the corresponding relationship.

Also, the waving frequency fb on the liquid surface can depend on the flow rate of processing liquid stored in the processing tank 10. The flow rate here is, for example, the flow rate of the processing liquid flowing through the circulation pipe 51. The flow rate is controlled by pump 52, for example. For example, when the pump 52 is driven and the flow rate of the processing liquid changes, the frequency fb can change depending on the flow rate. Therefore, the frame rate fa of the camera 30 may be set according to the flow rate. For example, the corresponding relationship between the flow rate and the frame rate fa may be set in advance by simulation or experiment and stored in the storage 94. The controller 90 may, for example, grasp the flow rate of the processing liquid as a control parameter, and determine the frame rate fa based on the flow rate and the corresponding relationship.

Also, the waving frequency fb on the liquid surface can depend on a type of processing liquids stored in the processing tank 10. That is, the frequency fb when a certain type of processing liquid is stored in the processing tank 10 can differ from the frequency fb when another type of processing liquid is stored in the processing tank 10. Therefore, the frame rate fa of the camera 30 may be set according to the type of processing liquid. For example, the corresponding relationship between the type of processing liquid and the frame rate fa may be set in advance by simulation or experiment and stored in the storage 94. The controller 90 may, for example, grasp the type of the processing liquid as a control parameter, and determine the frame rate fa based on the processing liquid and the corresponding relationship.

<Bubbling>

Figure 9:
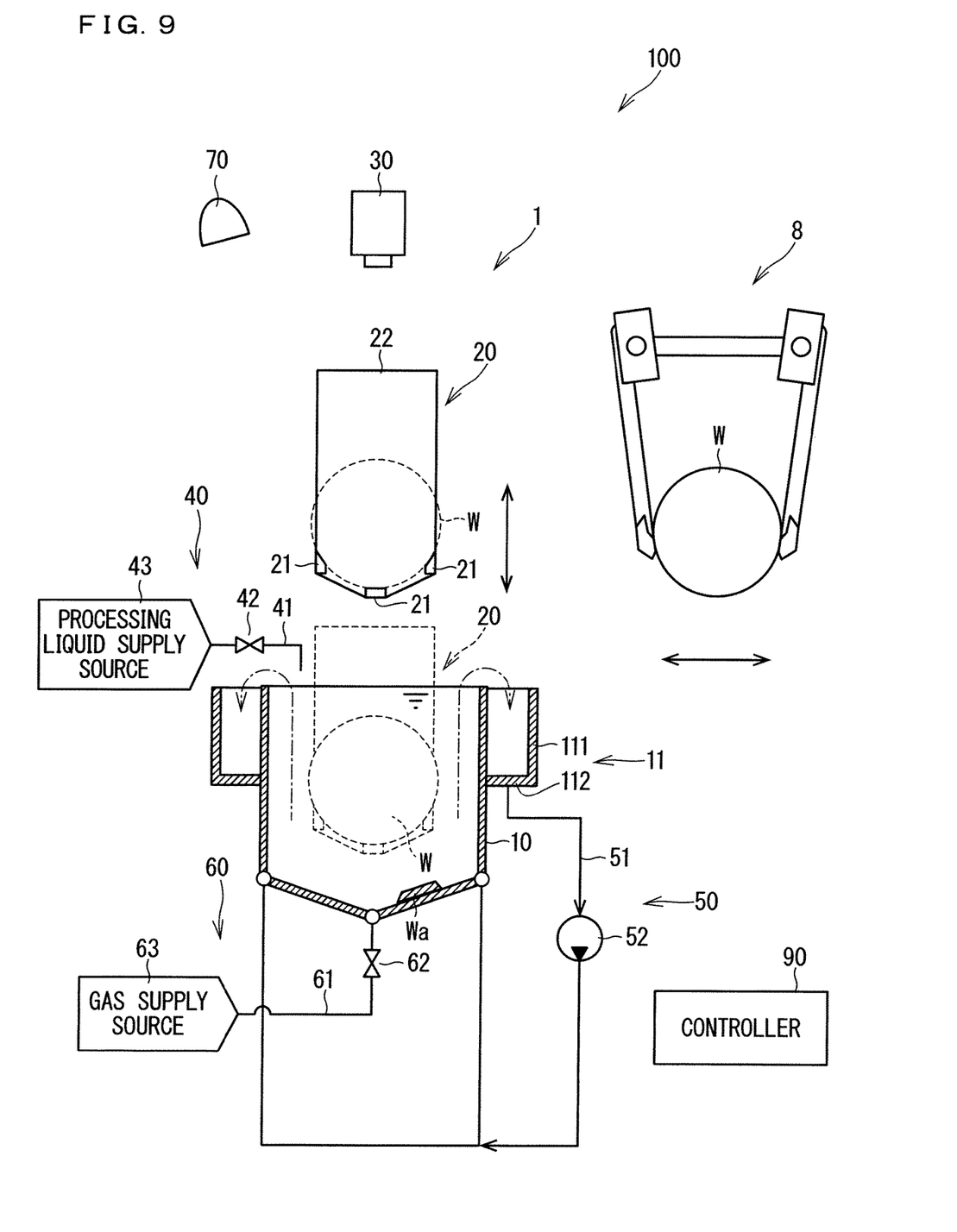
FIG. 9 is a diagram schematically illustrating an example of a configuration of a modification example of a substrate processing apparatus.

FIG. 9 is a diagram schematically illustrating an example of a configuration of a modification example of a substrate processing apparatus 100. In the substrate processing apparatus 100 according to the modification example, the processing unit 1 further includes a bubbling unit 60. The bubbling unit 60 supplies gas to the processing liquid inside the processing tank 10 and generates a plurality of bubbles in the processing liquid.

In the example of FIG. 9, the bubbling unit 60 includes a gas supply pipe 61 and a valve 62. The gas supply pipe 61 is a pipe for supplying gas to the inside of the processing tank 10. The upstream end of gas supply pipe 61 is connected to a gas supply source 63. The gas supply source 63 includes a reservoir that stores gas. An inert gas such as nitrogen and a rare gas such as argon gas is adoptable as the gas. The downstream end of gas supply pipe 61 is connected to the bottom of the processing tank 10, for example. The gas discharged from the downstream end of the gas supply pipe 61 moves vertically upward in the processing liquid as bubbles.

The valve 62 is provided on the gas supply pipe 61. Opening and closing the valve 62 switches the supply and stop of the gas to the processing liquid. The valve 62 is controlled by controller 90.

The bubbling unit 60 supplies the gas to the processing liquid while the plurality of substrates W are immersed in the processing liquid, for example. For example, the cleaning performance for the substrates W is improved thereby.

The monitoring process of the substrate processing apparatus 100 according to such a modification example is the same as the flowchart of FIG. 3. However, in the capturing step (Step S1), the camera 30 captures the inside of the processing tank 10 in a state where the bubbling unit 60 generates little or no gas bubbles in the processing liquid. That is, the camera 30 captures the inside of the processing tank 10, with the valve 62 closed. Therefore, the plurality of captured images IM1 obtained in the capturing step include little or no gas bubbles. Therefore, each captured image IM1 can more clearly include the state of the inside (for example, the bottom) of the processing tank 10, compared to the case where each captured image IM1 includes gas bubbles. Therefore, also in the smoothed image IM2 generated based on the integration of the plurality of captured images IM1, the state of the inside of the processing tank 10 is included more clearly than when there are gas bubbles, the monitoring processing unit 92 can monitor the inside of the processing tank 10 with high accuracy based on the smoothed image IM2.

<Cause of Waving on Liquid Surface>

In the above example, the liquid surface of the processing liquid in the processing tank 10 is waving due to the up-flow circulation. However, the up-flow circulation is not the only cause for waving on the liquid surface. For example, when the lifter 20 moves up a plurality of processed substrates W from the processing position to the delivery position, waving is caused on the liquid surface of the processing liquid due to the moving up movement. After the plurality of substrates W are transported to the transporting unit 8 and the transporting unit 8 moves the plurality of substrates W from the delivery position, waving can also remain on the liquid surface. In this state, the substrate processing apparatus 100 may perform monitoring processing.

<Type of Foreign Matter>

Although in the above example, the description has been made that the substrate piece Wa is taken as an example of the foreign matter remaining inside the processing tank 10, the foreign matter is not necessarily limited to this. The foreign matter may be, for example, pieces of flaked-off plating peeled off from the plating of the substrates W.

As described above, the substrate processing apparatus 100 and the monitoring method in the substrate processing apparatus 100 have been described in detail. However, the invention has been shown and described in detail, the foregoing description is in all aspects illustrative and not restrictive. It is understood that numerous other modification examples not having been described can be devised without departing from the scope of the disclosure. Each configuration described in the above embodiment and modification example can be appropriately combined or omitted as long as they do not contradict each other.

What is claimed is:

1. A substrate processing apparatus configured to collectively process a plurality of substrates by immersing the plurality of substrates in a processing liquid, comprising:
   a processing tank that stores the processing liquid;
   a lifter configured to move the plurality of substrates up and down, between an up position which is a delivery position above the processing tank for the substrates and a down position which is a processing position inside the processing tank for the substrates,
   a camera provided vertically above the processing tank and figured to generate a plurality of items of captured image data obtained by capturing images inside of the processing tank in a state where the processing liquid is stored in the processing tank;
   a controller configured to generate smoothed image data obtained by smoothing a brightness distribution of the images caused by waving of a liquid surface of the processing liquid, said smoothing being based on integration of the plurality of items of captured image data, and said controller being configured to monitor the inside of the processing tank based on the smoothed image data, the controller performing the monitoring in a state when the lifter is at the delivery position; and
   a storage device is configured to store reference image data obtained based on integration of a plurality of items of normal image data generated by the camera capturing the inside of the processing tank in a normal condition, wherein the controller is configured to determine whether there is an abnormality in the processing tank based on a comparison between the smoothed image data and the reference image data.

2. The substrate processing apparatus according to claim 1, wherein
   a frame rate of the camera is set according to a frequency of the waving caused on the liquid surface of the processing liquid.

3. The substrate processing apparatus according to claim 2, wherein
   the frame rate of the camera is ten times or more the frequency.

4. The substrate processing apparatus according to claim 1, wherein a capturing period of the camera is one cycle or more of the waving caused on the liquid surface of the processing liquid.

5. A monitoring method in a substate processing apparatus, comprising:
   a capturing step in which a camera provided above a processing tank generates a plurality of items of captured image data obtained by capturing the inside of the processing tank in a state where a processing liquid is stored in the processing tank and a lifter is at a delivery position above the processing tank for substrate delivery, wherein the lifter is configured to lift a plurality of substrates up and down, between an up position which is the delivery position and a down position which is a processing position inside the processing tank for the substrate;
   a waving smoothing step generating smoothed image data obtained by smoothing a brightness distribution of images caused by waving of a liquid surface of the processing liquid, said smoothing being based on integration of the plurality of items of captured image data;
   a monitoring step monitoring the inside of the processing tank based on the smoothed image data, and wherein a storing step storing reference image data obtained based on integration of a plurality of items of normal image data generated by the camera capturing the inside of the processing tank in a normal condition, wherein determination of whether there is an abnormality in the processing tank is based on a comparison between the smoothed image data and the reference image data.

* * * * *